United States Patent
Kim

(10) Patent No.: US 7,903,222 B2
(45) Date of Patent: *Mar. 8, 2011

(54) LIQUID CRYSTAL DISPLAY AND METHOD FOR MANUFACTURING THE SAME

(75) Inventor: Dong-Gyu Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/706,664

(22) Filed: Feb. 16, 2010

(65) Prior Publication Data

US 2010/0141888 A1    Jun. 10, 2010

Related U.S. Application Data

(63) Continuation of application No. 11/542,298, filed on Oct. 2, 2006, now Pat. No. 7,688,415, which is a continuation of application No. 11/208,781, filed on Aug. 23, 2005, now Pat. No. 7,116,391, which is a continuation of application No. 10/062,465, filed on Feb. 5, 2002, now Pat. No. 6,937,314.

(30) Foreign Application Priority Data

Feb. 7, 2001   (KR) .................................. 2001-5967

(51) Int. Cl.
  *G02F 1/1345* (2006.01)
  *G02F 1/1333* (2006.01)
(52) U.S. Cl. .......... 349/149; 349/151; 349/152; 349/158
(58) Field of Classification Search .................. 349/149, 349/151, 152, 158
See application file for complete search history.

(56) References Cited

U.S. PATENT DOCUMENTS

| | | | |
|---|---|---|---|
| 4,295,711 A | | 10/1981 | Tanaka et al. |
| 5,352,318 A | | 10/1994 | Takabayashi et al. |
| 5,636,329 A | * | 6/1997 | Sukegawa et al. ............ 349/149 |
| 6,128,051 A | * | 10/2000 | Kim et al. ....................... 349/40 |
| 6,204,081 B1 | | 3/2001 | Kim et al. |
| 6,690,185 B1 | | 2/2004 | Khandros et al. |
| 6,697,040 B2 | | 2/2004 | Imajo et al. |
| 6,937,314 B2 | | 8/2005 | Kim |
| 7,116,391 B2 | * | 10/2006 | Kim .............................. 349/149 |
| 7,262,827 B2 | * | 8/2007 | Yoo et al. ....................... 349/150 |

FOREIGN PATENT DOCUMENTS

JP       1985-082685 U     6/1985

(Continued)

*Primary Examiner* — Mike Qi
(74) *Attorney, Agent, or Firm* — Innovation Counsel LLP

(57) ABSTRACT

Disclosed are a liquid crystal display (LCD) and a method for manufacturing the same, in which connection stability is improved when connecting a COG, A COF, or an FPC to a driving circuit. A substrate of the LCD has a display region and a non-display region at a peripheral area thereof. Terminals are provided to electrically connect an external circuit and a circuit of the display region and the non-display region. A flat protective layer is formed on the terminals. A plurality of pads are respectively formed of a first contact region and a flat second contact region, and each of the pads contacts a corresponding terminal, which is formed through a pad contact hold formed on the protective layer, at the first contact region, and each of the pads is electrically connected through an anisotropic conductive resin to a terminal of the external circuit by a pressing process at the flat second contact region.

10 Claims, 25 Drawing Sheets

FOREIGN PATENT DOCUMENTS

| | | |
|---|---|---|
| JP | 08-110528 | 4/1996 |
| JP | 2000-221540 A | 8/2000 |
| JP | 2000-347206 A | 12/2000 |
| KR | 10-1999-0018395 | 3/1999 |
| KR | 10-2000-0059471 A | 10/2000 |
| KR | 10-2000-0066398 A | 11/2000 |

* cited by examiner

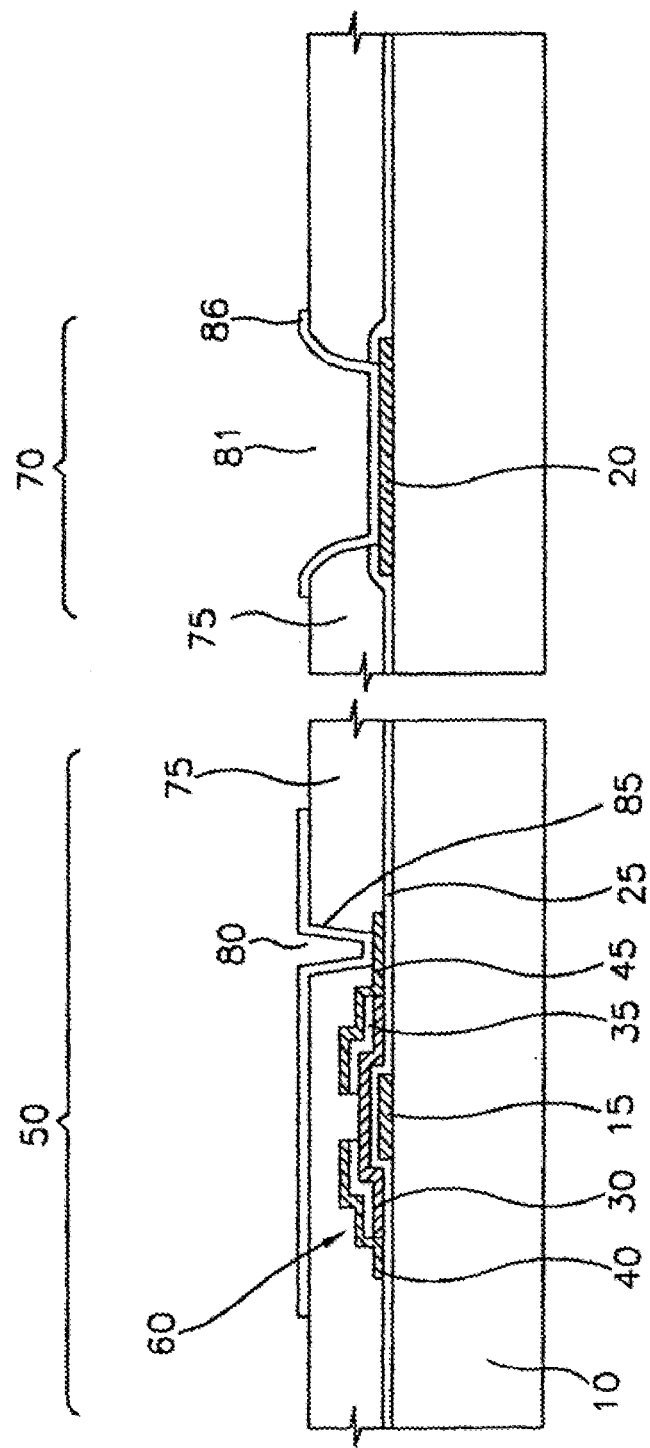

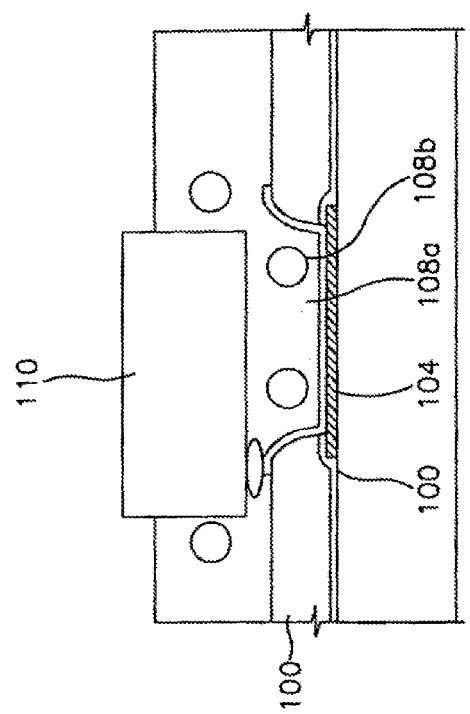

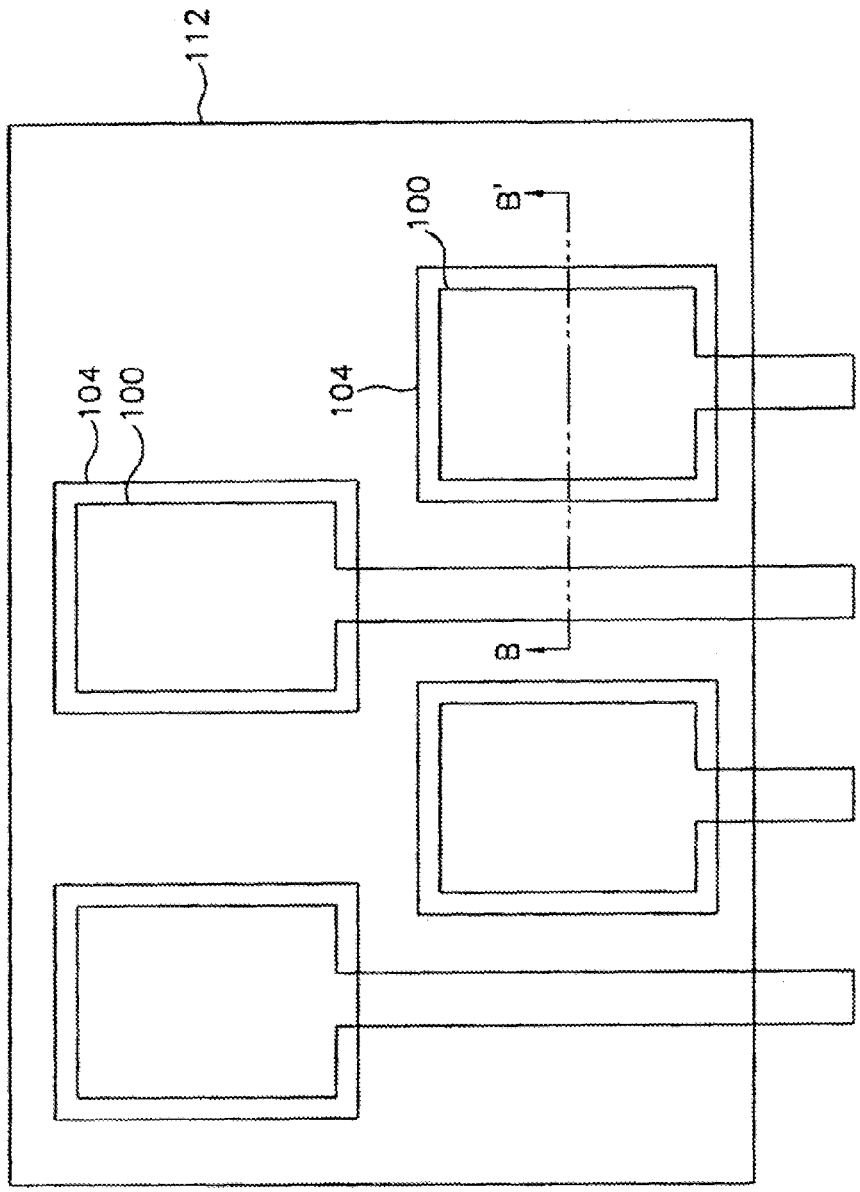

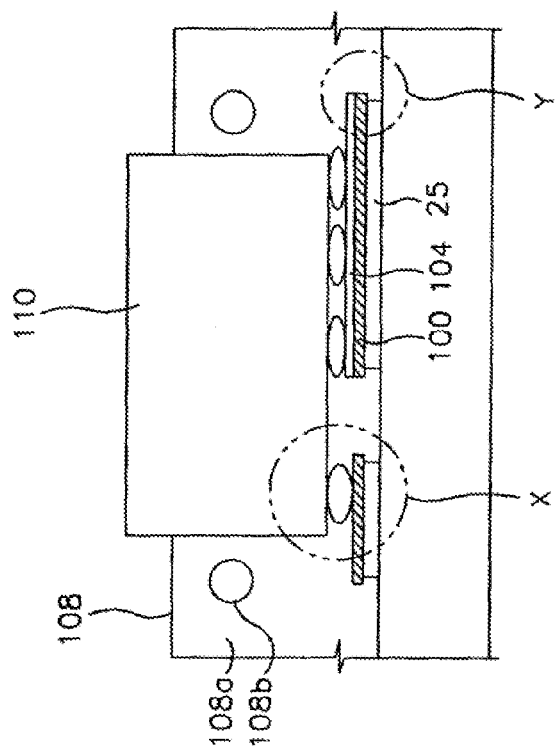

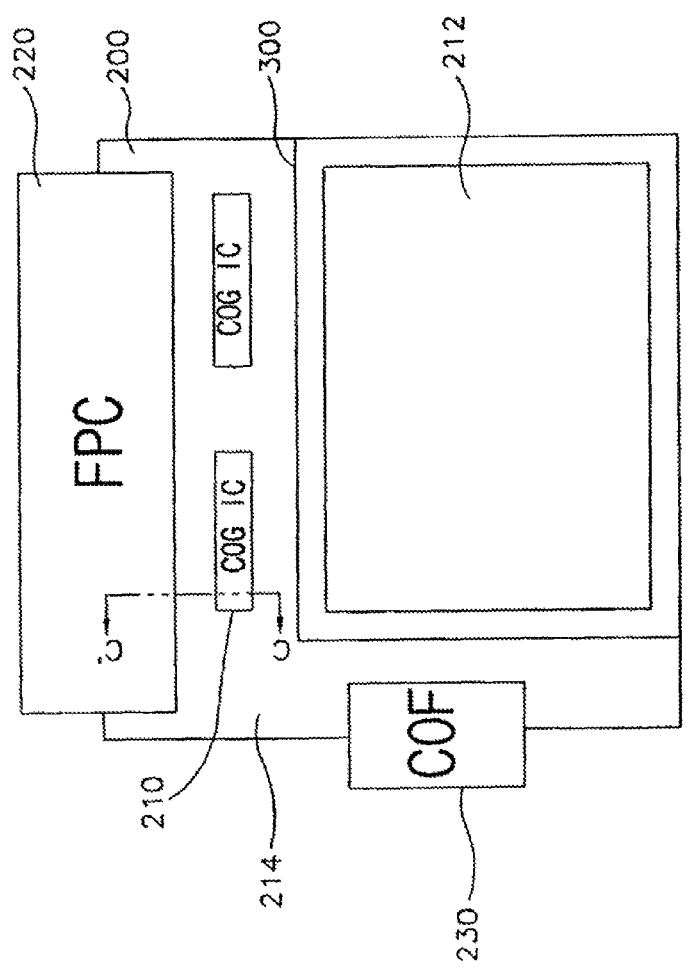

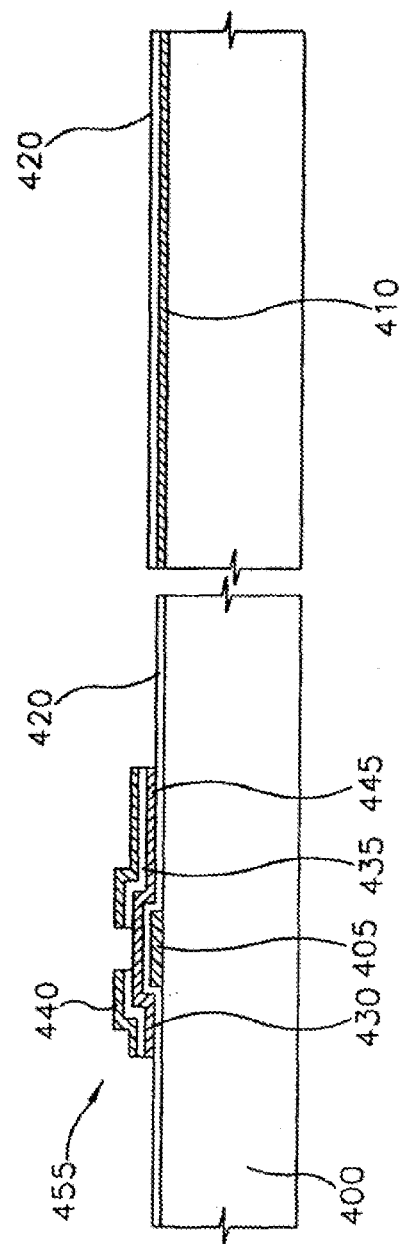

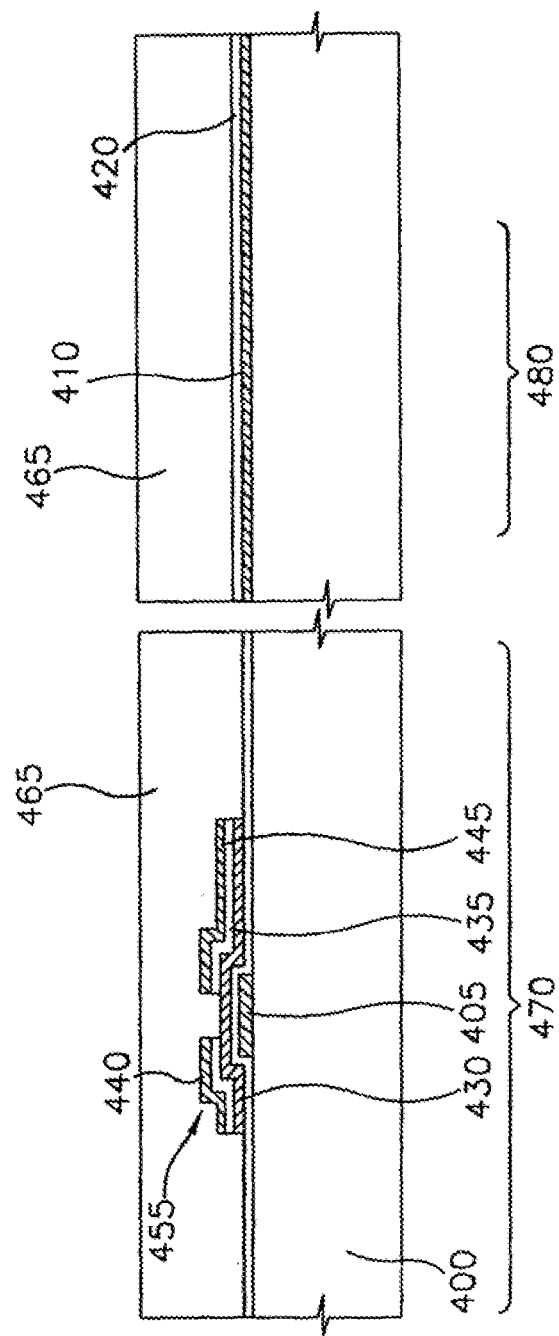

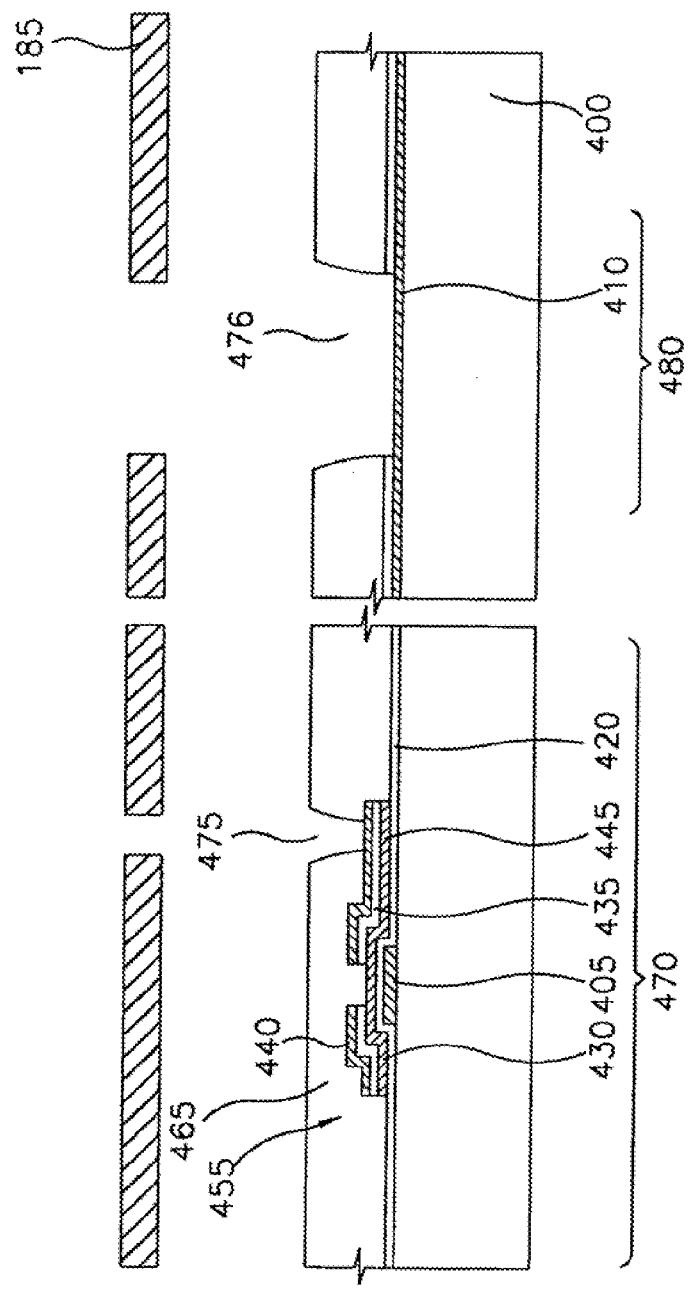

LIQUID CRYSTAL DISPLAY AND METHOD FOR MANUFACTURING THE SAME

CROSS REFERENCE TO RELATED APPLICATION

This application is a continuation of U.S. patent application Ser. No. 11/542,298, filed Oct. 2, 2006, by Dong-Gyu Kim, entitled "LIQUID CRYSTAL DISPLAY AND METHOD FOR MANUFACTURING THE SAME," which is a continuation of U.S. patent application Ser. No. 11/208, 781, filed Aug. 23, 2005 by Dong-Gyu Kim, entitled "LIQUID CRYSTAL DISPLAY AND METHOD FOR MANUFACTURING THE SAME," now U.S. Pat. No. 7,116,391, issued on Oct. 3, 20065, which is a continuation of U.S. patent application Ser. No. 10/062,465, filed Feb. 5, 2002, now U.S. Pat. No. 6,937,314, issued Aug. 30, 2005, which claims priority of Korean Patent Application No. 2001-5967, filed Feb. 7, 2001.

BACKGROUND OF THE INVENTION

1. Field of the Invention

The present invention relates to a liquid crystal display and a manufacturing method thereof, and more specifically to a liquid crystal display and a manufacturing method thereof, in which connection stability is improved when connecting a COG (Chip On Glass), a COF (Chip On Film), or an FPC (Flexible Printed Circuit film) to a driving circuit.

2. Description of the Related Art

In an information-oriented society these days, the role of an electronic display is getting more important. The electronic displays of all kinds are widely used in various industrial fields. As techniques of the electronic display field are continuously developed, various electronic displays having new functions are provided corresponding to diverse requirements of the information-oriented society.

Generally, the electronic display is an apparatus for visually transmitting information to a person. That is, an electric information signal output from various electronic equipments is converted into a visually recognizable optical information signal in the electronic display. Therefore, the electronic display serves as a bridge for connecting the person and the electronic equipments.

The electronic display is classified into an emissive display that displays the optical information signal by emitting lights, and a non-emissive display that displays the signal by optical modulation such as light-reflecting, dispersing and interference, etc. The emissive display is called an active display. Examples are a CRT (Cathode Ray Tube), a PDP (Plasma Display Panel), an LED (Light Emitting Diode) and an ELD (Electroluminescent Display), etc. The non-emissive display is called a passive display. The examples are an LCD (Liquid Crystal Display) and an EPID (Eelectrophoretic Image Display), etc.

The CRT has been used for image display such as in a television and a monitor, etc., over the longest period of time. The CRT has enjoyed the highest market share because of high display quality and low costs. However, it also has much disadvantage such as heavy weight, large volume and high power consumption.

Meanwhile, due to rapid development of semiconductor technologies, various kinds of electronic devices are driven at lower voltage and consuming less power, rendering the electronic equipments much slimmer and lighter. Therefore, a flat panel type display of slimmer and lighter property as well as the less driving voltage and lower power consumption property is required according to the new environment.

An LCD, among various flat panel type displays, is much slimmer and lighter than any other displays. It can be driven at a lower voltage and consume less power. It also shows high display quality similar to the CRT. Therefore, the LCD is widely used in various electronic equipments. Further, since the LCD can be facilely manufactured, its application is getting wider. The LCD is classified into a backlight LCD that displays an image using an external light source and a reflective LCD that displays the image using ambient light instead of the external light source. Methods of manufacturing the backlight LCD and the reflective LCD are disclosed in Korean Paten Laid-Open Publication Nos. 1999-18395 entitled "Method of manufacturing polycrystalline silicon thin film transistor", 2000-66398 entitled "Method of manufacturing TFT LCD panel" and 2000-59471 entitled "Reflective type LCD and manufacturing method thereof".

FIGS. 1A, 113, and 1C are cross-sectional views disclosing a conventional method of manufacturing the LCD.

Referring to FIG. 1A, a metallic material such as Al and Cr, etc., is deposited on a substrate 10 of an insulating material, and then patterned to form a gate electrode 15 and a gate terminal 20. Continuously, a gate insulating layer 25 is formed on the entire surface of the substrate 10, where the gate electrode and terminal 15, 20 are formed, by a PCVD (plasma chemical vapor deposition) process.

Thereafter, an in-situ doped n+ type amorphous silicon film is deposited on the gate insulating layer 25 and then patterned to form an amorphous silicon layer 30 and an ohmic contact layer 35 on the gate electrode 15.

The metallic material such as Mo, Al, Cr or W, etc., is further stacked on the gate electrode 15 and then patterned to form a source electrode 40 and a drain electrode 45. At this time, in a pad area 70 of the substrate 10, there is formed a data input terminal (not shown). Thus, in an active region 50 of the substrate 10 except the pad area 70, is formed a thin film transistor 60 including the gate electrode 15, the amorphous silicon layer 30, the ohmic contact layer 35, the source electrode 40 and the drain electrode 45.

Referring to FIG. 1B, an organic photoresist layer is stacked on the entire surface of the active region 50 and the pad region 70 of the substrate 10 to form a protective layer 75. Thus, the lower substrate 10 is completed.

Referring to FIG. 1C, in order to form a contact hole 80, 81, a mask (not shown) is positioned on an upper portion of the protective layer 75. Then, the contact hole 80, 81 is formed on the protective layer 75 by an exposing and developing process so as to partially expose the drain electrode 45 and the gate terminal 20.

Afterwards, the metallic material such as Al or Ni, having a high reflectivity, is deposited in an inner portion of the contact hole 80, 81 and on the organic insulating layer (protective layer) 75. The deposited metallic material is patterned in the form of a desired pixel to form a reflective electrode 85 and a pad 86. Then, an alignment layer is formed thereon. An upper substrate (not shown) including a color filter, a transparent electrode and the alignment layer is formed facing the lower substrate 10.

The upper substrates and the lower substrate are put together with spacers interposed therebetween. A liquid crystal layer is formed at a space between the upper substrate and the lower substrate to complete the LCD.

The completed LCD is connected to a connecting device such as a COG, a COF or an FPC, etc., so as to apply a driving signal through the pad 86 from an outside.

However, in the above-mentioned conventional method of manufacturing the LCD, since the organic insulating layer or other thick layer is used as the protective layer of the thin film transistor, a step difference is generated between a pad portion under which the metal layer is formed and a remaining portion. Therefore, there is a problem that a pressing failure occurs due to the step difference, when connecting a bump, etc., of the COG, the COF or the FPC to the pad portion.

FIG. 2A is a plan view of a conventional pad structure having the step difference by opening the contacts according to each terminal, and FIG. 2B is a cross sectional view taken along a line A-A when connecting the bump by a pressing process.

Referring to FIGS. 2A and 2B, in the conventional individual terminal opening type pad structure, a pad contact hole 102 having a little smaller surface area than that of a lower terminal 100 is formed in a protective layer 106. Then, a pad 104 having an area a little wider than the surface area of the terminal 100, is formed in order to electrically connect the terminal 100 and the pad 104.

As a result, the protective layer is thickly formed in a thickness of about 5 pm, the terminal of the pad contact hole 102 is formed about 3-4 pm high. An adhesive resin (ACF: anisotropic conductive film) 108a containing a conductive ball 108b is coated thereon. A bump 110 connected to a terminal part of a driver IC is pressed on the ACF 108a. Therefore, the pad 104 and the bump 110 are electrically connected to each other by the conductive ball 108b compressed therebetween.

As shown in FIG. 2B, however, since only a peripheral region of the pad contact hole is electrically connected by the step difference of the pad contact hole 102, and the conductive ball 108b is not fully compressed at the center of the pad 104, an electrical connection may fail. Therefore, a contact resistance generally increases, thereby lowering electrical properties.

In addition, if a misalignment between the bump and the pad occurs, the contact resistance further increases. The high contact resistance at the contact portion generates a large amount of resistance heat. As the result, the contact is cut off and thus the reliability of the device is lowered.

Therefore, in order to solve the above problem, there has been provided a terminal batch opening method. FIG. 3A shows a plan view of a conventional flat pad structure formed by collectively opening the terminals and FIG. 3B shows a cross sectional view of the flat pad structure when connecting a bump by a pressing process.

Referring to FIGS. 3A and 3B, an opening 112 including the whole terminals is formed on the protective layer to open the plurality of terminals. After depositing a pad conductive material thereon, a photolithography process is performed to form a pad pattern every terminal. Therefore, a flat pad 104 without a contact step difference is formed on the terminal 100. In this method, all of the conductive balls 108b is fully compressed between the bump 110 and the pad 104, thereby improving the contact capability there between.

However, as shown in FIG. 3B, if the bump 110 is misaligned, the protective layer between the terminals 100 is removed due to the opening 112, and thus the conductive ball 108b is compressed at a portion in which the bump 100 is overlapped with an adjacent terminal, as shown in an "X" portion of FIG. 3B. Therefore, two terminals are electrically connected with one bump at the same time, causing contact failures.

Further, as shown in a "Y" portion of the FIG. 3B, when the opening 112 is formed where a data input terminal is formed, an under-cut portion is formed at an insulating layer of a lower portion of the terminal 100. Therefore, the terminal 100 tends to peel off, or the adhesive resin 108a is not sufficiently coated under the under-cut portion, exposing the under-cut portion to the outside. Also, moisture or contaminant infiltrates through the exposed portion and electrochemically reacts with a metal portion of the terminal to cause corrosion of the metal portion.

SUMMARY OF THE INVENTION

Therefore, it is an object of the present invention to provide an LCD capable of securing connection stability when connecting a COG, a COF and FPC, etc with an LCD panel.

It is another object of the present invention to provide a method that is suitable for manufacturing the above LCD.

To achieve the aforementioned object of the present invention, there is provided an LCD comprising: a substrate; a pixel array formed on a display region of the substrate in a matrix configuration; a plurality of first terminals which are formed at a non-display region of the substrate, the first terminals having a contact region and applying an electrical signal to a plurality of column lines and row lines of the pixel array; a protective layer in which contact holes are formed corresponding to the contact region of each of the terminals, and which covers the pixel array and the first terminals; and a plurality of first pads formed on the protective layer to be overlapped with each of the first terminals with a surface area greater than the contact region, the first pads electrically connected through the contact holes to each of the first terminals and substantially electrically connected to an external circuit at a region other than the contact region.

Preferably, the terminals are aligned in zigzag of two rows. Each of first inner terminals arranged along an inside portion of the first row among the first terminals, has a first contact region at an inner portion thereof and a second contact region at an outer portion thereof and each of first outer terminals arranged along an outside portion of the first row among the first terminals has a first contact region at an outer portion thereof and a second contact region at an inner portion thereof.

Further, output terminals of at least one or more IC device are bonded at the area except the contact region of the first pads by a bump bonding method.

According to one embodiment of the present invention, a plurality of second pads are formed on the protective layer to be aligned along an edge portion of the substrate in one row, and input terminals of the IC device are respectively bonded to one side of each second pad.

Preferably, the other side of each second pad is boned to terminals of a flexible printed circuit board, and the plurality of second pads are respectively electrically connected through at least one or more contact hole to a plurality of second terminals which is formed at a lower portion of the protective layer.

Preferably, an entire surface area of at least one or more contact region of each second terminal is one third and below of an entire surface area of each terminal.

The second terminals may respectively have the contact regions that are aligned at both ends of the second terminals in a length direct, or the plurality of contact regions that are aligned at regular intervals in the length direction, or the elongated contact regions which are aligned at both ends of the second terminals in width direction.

The first pads may be aligned in one row, and connected through other area except the contact region to terminals of a TCP, a COF or an FPC.

A reflective type LCD according to another embodiment of the present invention comprises a first substrate in which a plurality of pixels are formed into a matrix configuration at a center portion thereof, and a plurality of terminal parts for applying an electrical signal to the pixels is formed at an edge portion thereof; a second substrate which is formed to be opposite to the first substrate; a liquid crystal layer which is formed between the first and second substrates; a reflective electrode which is formed at the center portion of the first substrate to have an irregular portion; a protective layer which is formed from a first area to a second area between the first substrate and the reflective electrode to have an opening for exposing each contact region of the plurality of terminals, the protective layer having the same surface structure as the reflective electrode at the first area and a flat surface structure at the second area; and a plurality of pads which is formed on the protective layer to include the opening and have a surface area greater than the opening, and connected through other area except the opening to a terminal part of an external circuit.

Further, an LCD according to the present invention comprises a first substrate having a pixel array circuit in which a plurality of pixels are formed into a matrix configuration at a center portion thereof, a plurality of data pads formed at a first peripheral region to apply a data signal through each data line to the plurality of pixels, and a plurality of gate pads formed at a second peripheral region to apply a gate signal through each data line to the pixels; a second substrate in which a color filter array is formed corresponding to the center portion of the first substrate and a transparent common electrode is formed thereon; a liquid crystal layer interposed between the first and second substrates.

The device further comprises at least one or more data driving IC chip which is bump-bonded to the data pads at the first peripheral region by a COG mounting way; and a gate driving IC chip bonded to the gate pads at the second peripheral region by a COF mounting way, wherein the data pads respectively have a surface area greater than that of a contact region contacted with the data line and are bonded to each terminal of the data driving IC chip at an area except the contact region, and the gate pads respectively have a surface area greater than that of a contact region contacted with the gate line and are bonded to each terminal of the gate driving IC chip at the area except the contact region.

To achieve the aforementioned second object of the present invention, there is provided a method of manufacturing an LCD comprising the steps of depositing and photo-etching a first conductive material on a substrate to form a gate pattern including a gate electrode, a gate line, and a gate terminal part; covering the gate pattern with a gate insulating layer; depositing and photo-etching a semiconductor material and a second conductive material on the gate insulating layer to form a data pattern including an active pattern, source and drain electrodes, a data line and a data terminal part; covering a resultant material with a protective layer; photo-etching the protective layer to open a contact region of the source electrode, the gate terminal part and the data terminal part; depositing and photo-etching a conductive material on the protective layer to a pixel electrode and a bonding pad, the bonding pad having a surface area greater than the contact region; and bonding a terminal part of a driving IC device at an area except the contact region of the bonding pad.

The protective layer has an irregular surface, and the pixel electrode is formed of a reflective metallic material selected from a group consisting of Al, an Al alloy, Ag and an Ag alloy. The driving IC device is mounted by a TCP, COF or COG method.

According to the present invention, the pad is formed on the thick protective layer in its longitudinal direction to have twice or more surface area as large as the first contact region. The remaining flat area except the first contact region is provided as the second area for contacting with an external circuit terminal. Therefore, even if the misalignment between the external circuit terminal and the pad is generated, a preferred contact property can be maintained.

BRIEF DESCRIPTION OF THE DRAWINGS

The above objects and other advantages of the present invention will become more apparent by describing in detail the preferred embodiments thereof with reference to the attached drawings in which:

FIGS. 1A through 1C are cross-sectional views of a conventional manufacturing method of an LCD;

FIGS. 2A and 2B are a plan view of a conventional pad structure having a contact step difference by opening contacts according to each terminal, and a cross-sectional view of the conventional pad structure when connecting a bump by a pressing process;

FIG. 3A is a plan view of a conventional flat pad structure formed by collectively opening terminals and FIG. 3B is a cross sectional view of the flat pad structure when connecting a bump by a pressing operation;

FIG. 4 is a plan view of a data COG mounting LCD according to one embodiment of the present invention;

FIGS. 13A, 13B, 14A, 14B, 15, 16A, 16B, 16C and 16D are sectional views showing a manufacturing. method of the LCD according to one embodiment of the present invention.

DETAILED DESCRIPTION OF THE PREFERRED EMBODIMENTS

Now, preferred embodiments of the present invention will be described in detail with reference to the annexed drawings.

FIG. 4 is a plan view of an LCD according to one embodiment of the present invention.

Referring to FIG. 4, an LCD panel according to the present invention includes a TFT substrate 200 and a color filter substrate 300. The color filter substrate 300 is formed with a color filter and a transparent common electrode. The TFT substrate 200 is disposed facing the color filter substrate 300. Liquid crystal is injected into a space between the TFT substrate 200 and the color filter substrate 300, and then sealed. The color filter substrate 300 has a surface area smaller than the TFT substrate 200. A portion in which the TFT substrate 200 is overlapped with the color filter substrate 300 corresponds to a display region 212, and a peripheral region which is the remaining area of the TFT substrate 200, corresponds to a non-display region 214.

On the non-display region 214, there are formed signal lines extended from the display region 212 to the non-display region 214, gate lines and pads connected to each end of data lines.

Further, in the non-display region 214, one end of a COG IC 210 as a data driving IC is connected to data line pads (not shown) by a bump bonding method, and the other end of the COG IC 210 is connected to a film cable or an FPC (flexible printed circuit) 220 to be connected through a circuit pattern formed at the peripheral area to an external integrated circuit board (not shown). The gate lines (not shown) are connected to a COF 230 as a flexible printed circuit having a gate driving IC device mounted thereon.

Figure 1A:
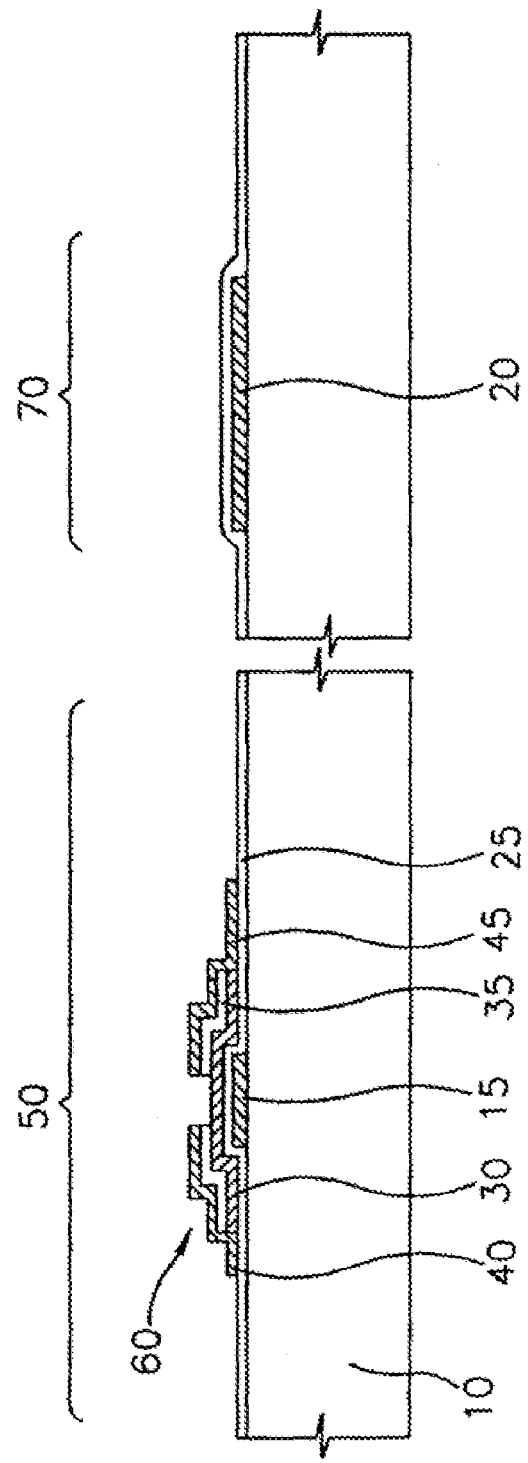
Figure 1B:
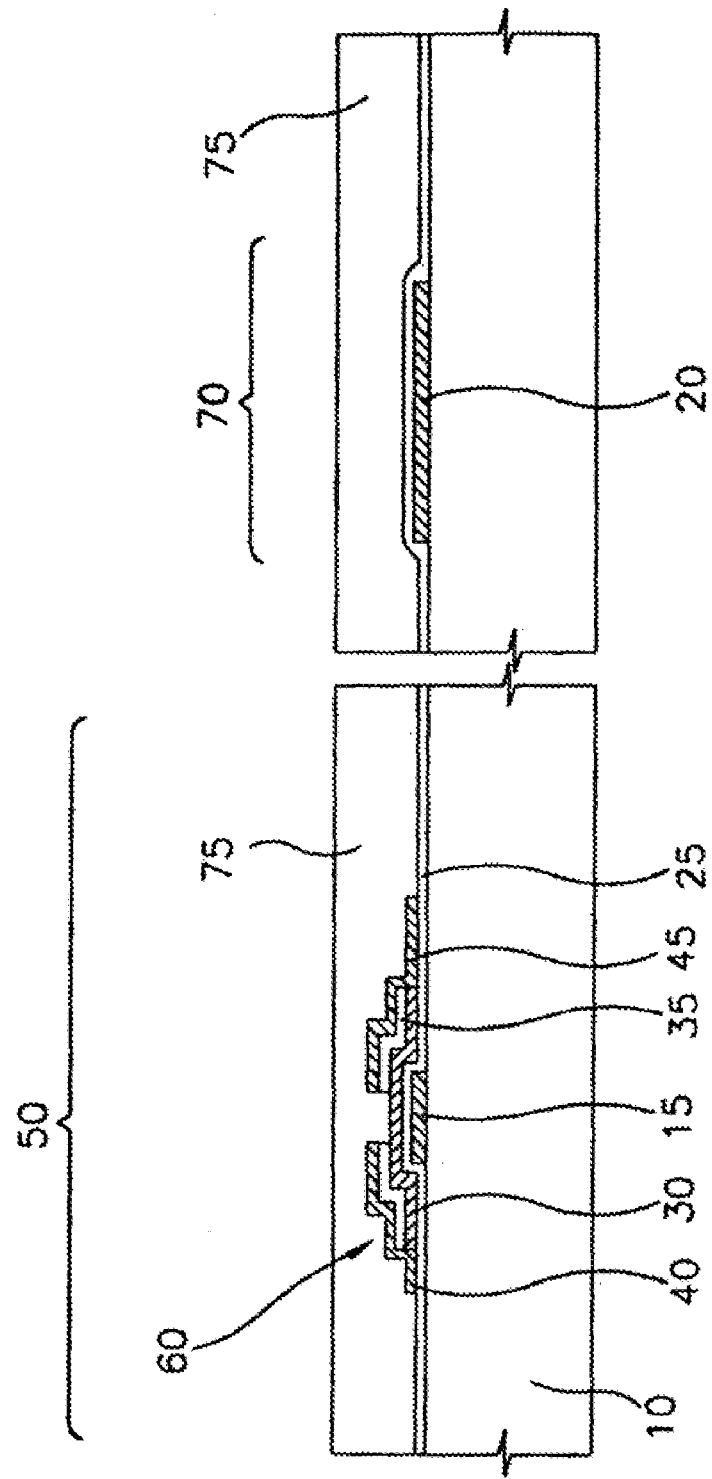
Figure 2A:
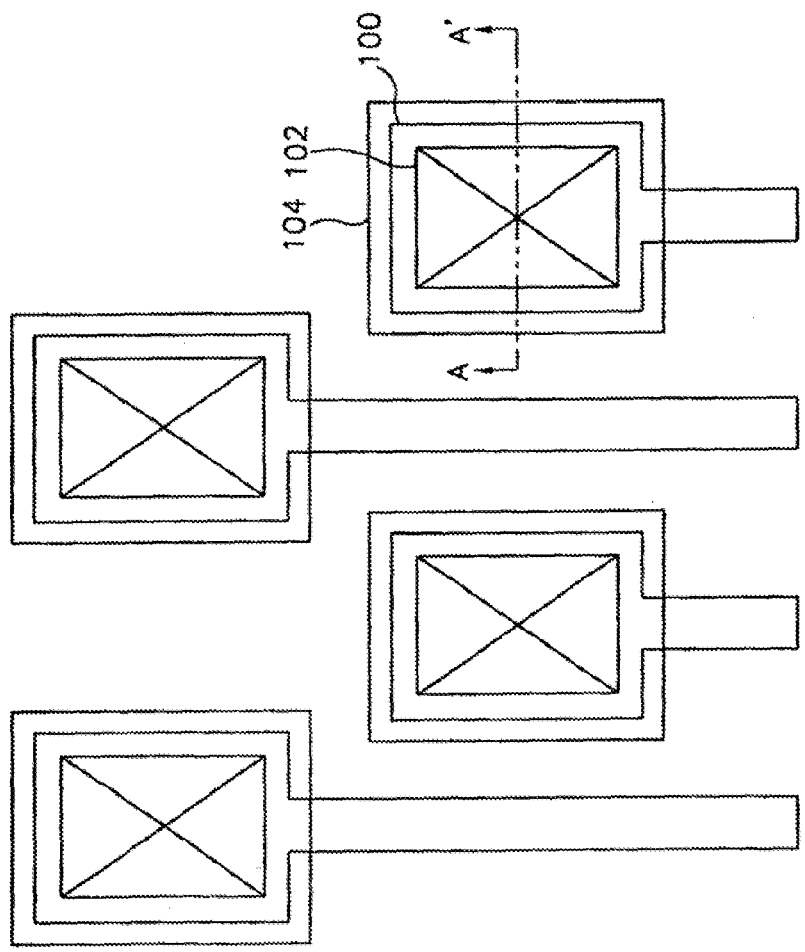
Figure 5:
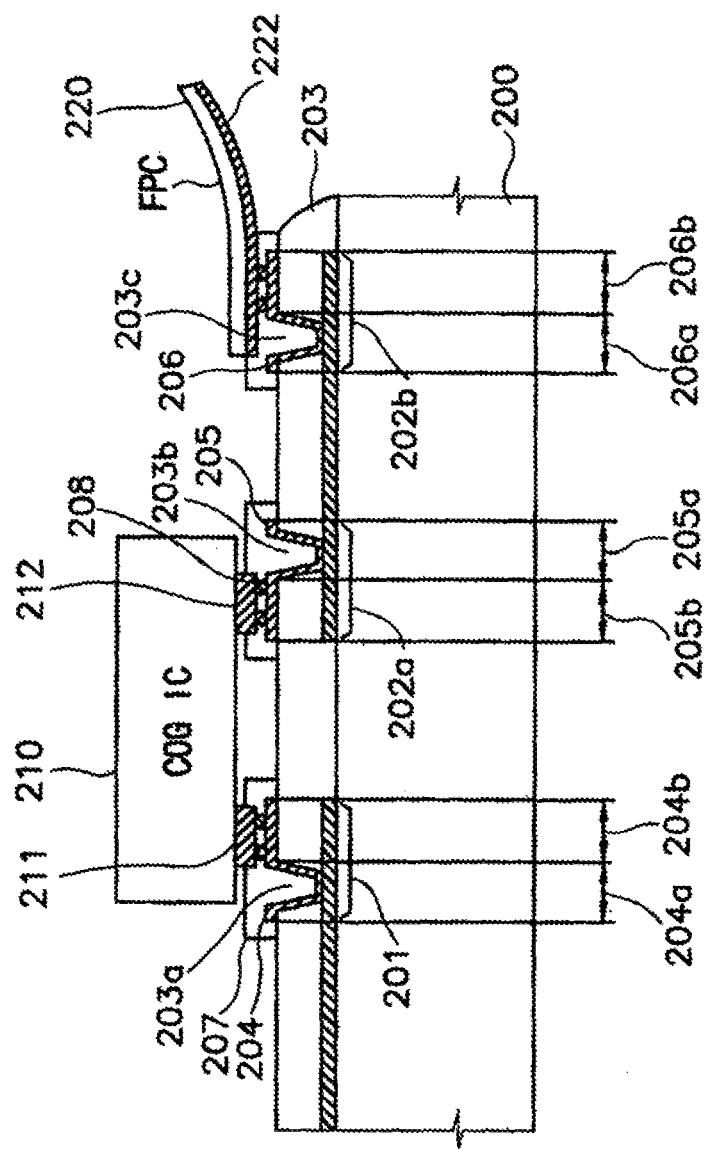
FIG. 5 is a cross-sectional view taken along the line C-C' of FIG. 4.

FIG. 5 is a cross-sectional view taken along the line C-C' of FIG. 4. On a substrate 200 are formed a plurality of first terminals 201, a plurality of second terminals 202a and a plurality of third terminals 202b. The second terminals 202a and the third terminals 202b are connected to each other through a metal line. The first, second and third terminals are covered by a protective layer 203. On the protective layer 203, there are formed pad contact holes 203a, 203b, 203c corresponding to each of the first, second and third terminals 201, 202a, 202b. First, second and third pads 204, 205, 206 are formed on the protective layer 203.

The first, second and third pads 204, 205, 206 are respectively formed with first contact regions 204a, 205a, 206a and second contact regions 204b, 205b, 206b. The second contact regions 204b, 205b, 206b of each pad have a flat plane on the protective layer 203. The first, second and third pads 204, 205, 206 are respectively coated by anisotropic conductive adhesive resin 207. The anisotropic conductive adhesive resin 207 contains a plurality of conductive balls 208.

Bumps 211, 212 of the COG IC 210 are aligned with the second contact region 204b, 205b of the first and second pads 204. Then, the COG IC 210 is pressed to compress the conductive balls 208 between the bumps 211, 212 and the second contact regions 204b, 205b. Thus, the bumps 211, 212 are electrically connected with the first pad 204 and the second pad 205, respectively. The bump 211 is an output terminal of the COG IC 210, and the bump 212 is an input terminal of the COG IC 210.

Further, an output terminal 222 of the FPC 220 is aligned with the second contact region 206b of the third pad 206 and then pressed on the second contact region 206b. The conductive balls 208 are compressed between the output terminal 222 and the second contact region 206b, so that the output terminal 222 of the FPC 210 is electrically connected with the third pad 206.

Figure 6:
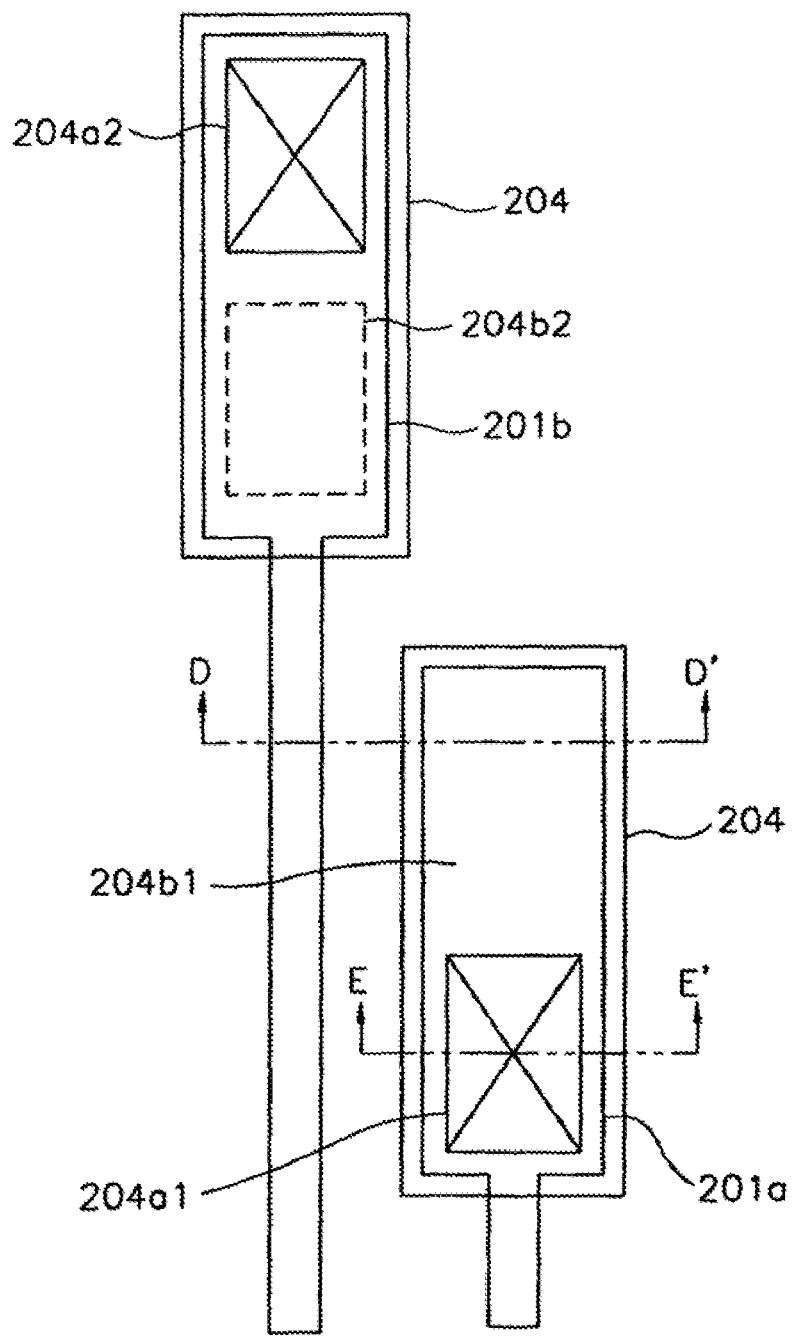
FIG. 6 is a plan view of a pad structure which is arranged in zigzag according to other embodiment of the present invention.

FIG. 6 is a plan view of a pad structure of the LCD according to one embodiment of the present invention.

Referring to FIG. 6, since a plurality of first terminals 201 formed at an extended portion of a data line have a very narrow pitch, the first terminals 201 are aligned alternately in a zigzag fashion. Each of first inner terminals 201a which are arranged along an inside portion of the first row among the first terminals 201, has a first contact region 204a1 at an inner portion thereof and a second contact region 204b1 at an outer portion thereof. Each of first outer terminals 201b that are arranged along an outside portion of the first row among the first terminals 201, has a first contact region 204a2 at an outer portion thereof and a second contact region 204b2 at an inner portion thereof. The bumps 211 as output terminals of the COG IC 210 are also aligned in two rows of zigzag type. The bumps of a first row are disposed such that they respectively correspond to the second contact regions of pads of the first row. The bumps of a second row are disposed such that they respectively correspond to the second contact regions of the pads of the second row.

Figure 7:
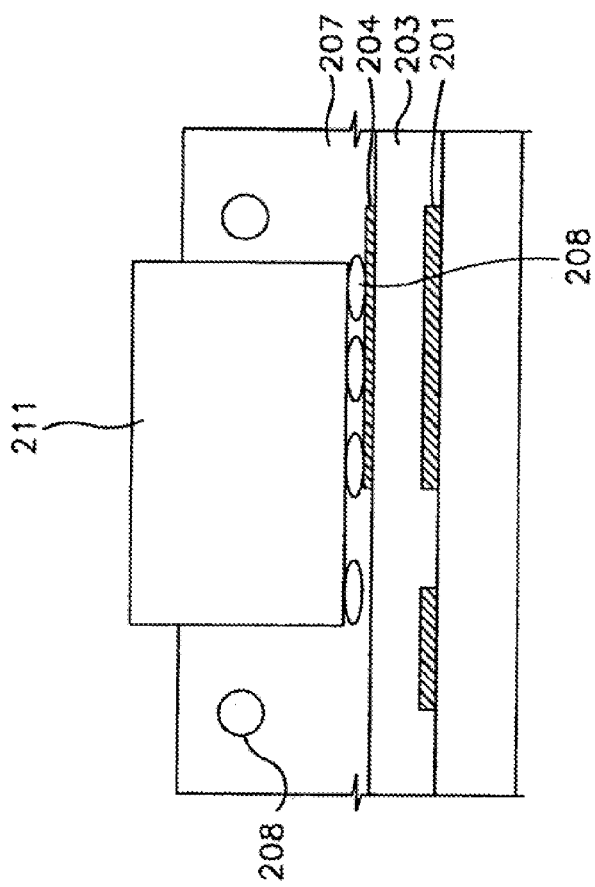
FIG. 7 is a cross-sectional view taken along the line D-D' of FIG. 6.

FIG. 7 shows a cross-sectional view taken along the line D-D' of FIG. 6. As shown in FIG. 7, the bump 211 is misaligned at the second contact region of the pad to be slightly shifted to a left side. However, since the bump 211 is pressed on a thick protective layer 203, it is not possible that the bump 211 may be shorted to an adjacent terminal.

Figure 8:
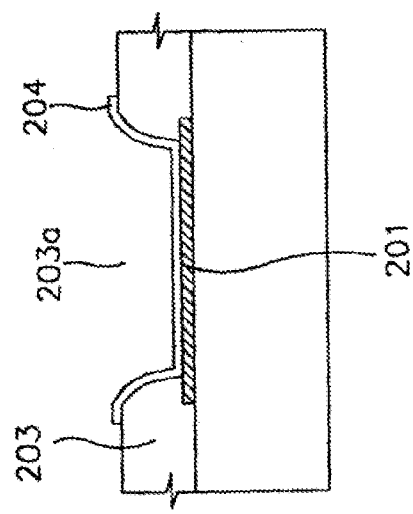
FIG. 8 is a cross-sectional view taken along the line C-C' of FIG. 6.

FIG. 8 shows a cross-sectional structure taken along the line E-E' of FIG. 6. As shown in FIG. 8, a surface of a pad 204 is not flat at a first contact region 204a due to a step coverage of a pad contact hole 203a.

According to the present invention, as described above, on the protective layer 203 is formed a pad of which a surface area is twice as large as that of a pad contact hole, and a flat contact region except the first contact region contacts the terminal of an external circuit or a driving IC device, thereby reducing the contact defect.

Figure 9:
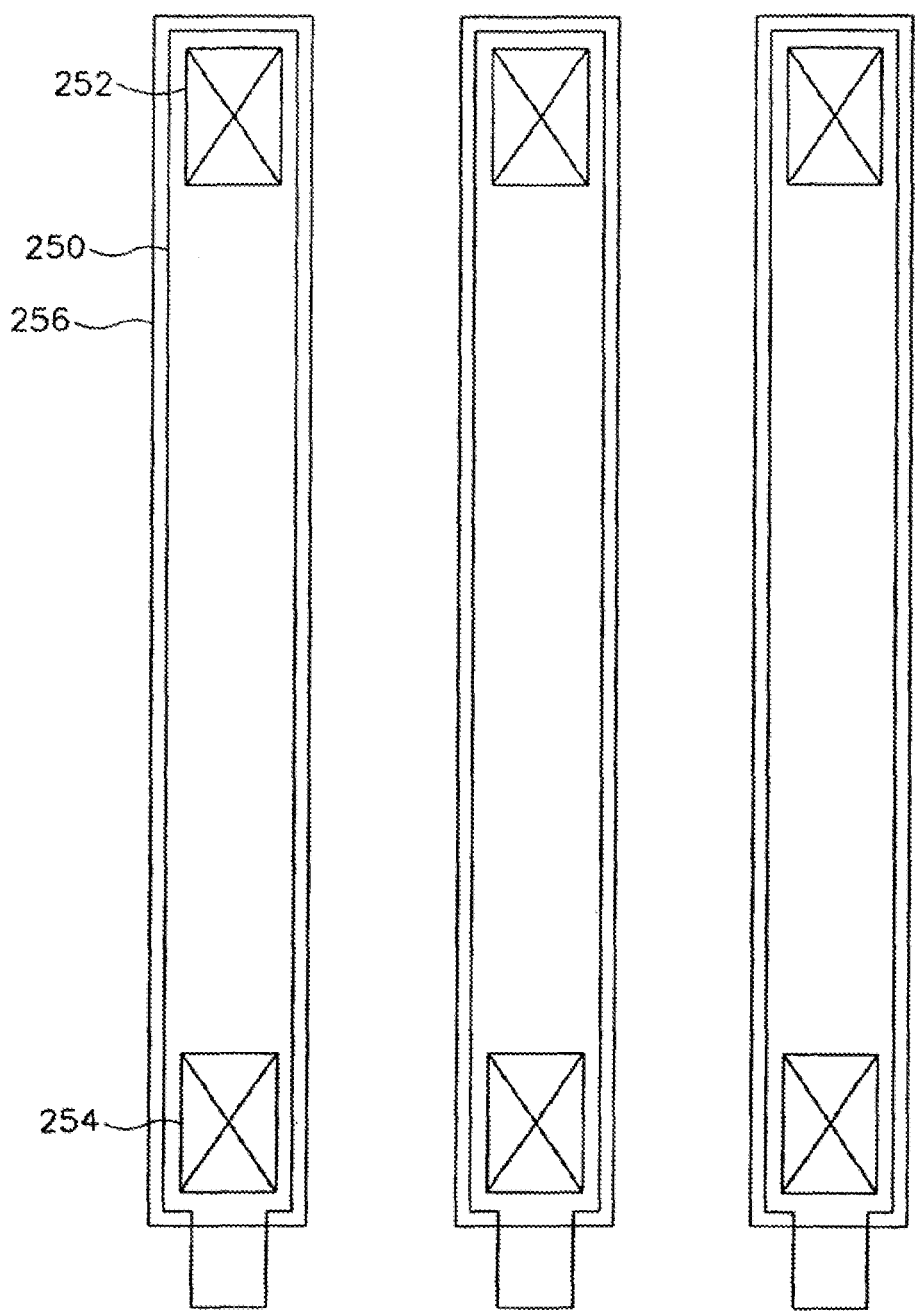
FIGS. 9, 10, and 11 are plan views of the pad structures which are aligned in one row according to embodiments of the present invention.
Figure 10:
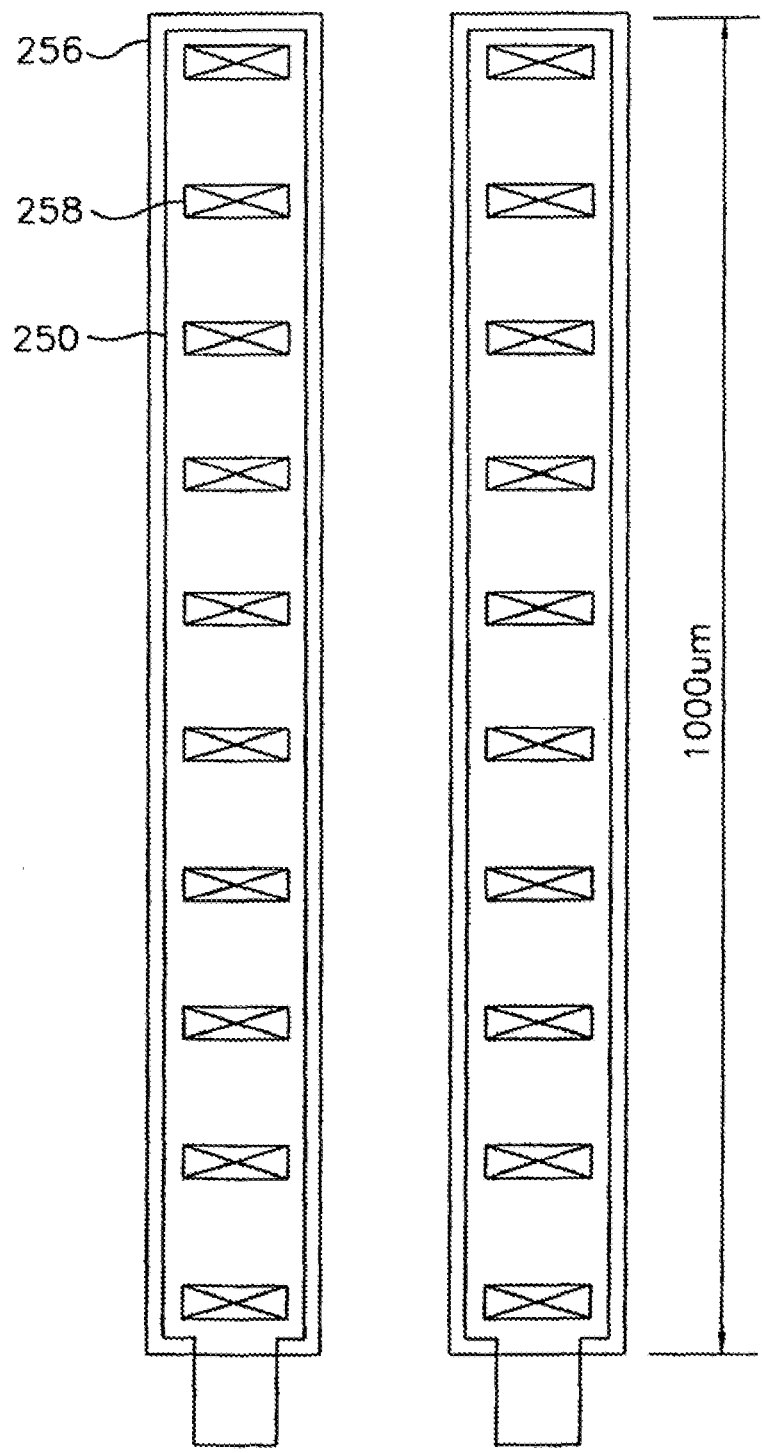
Figure 11:
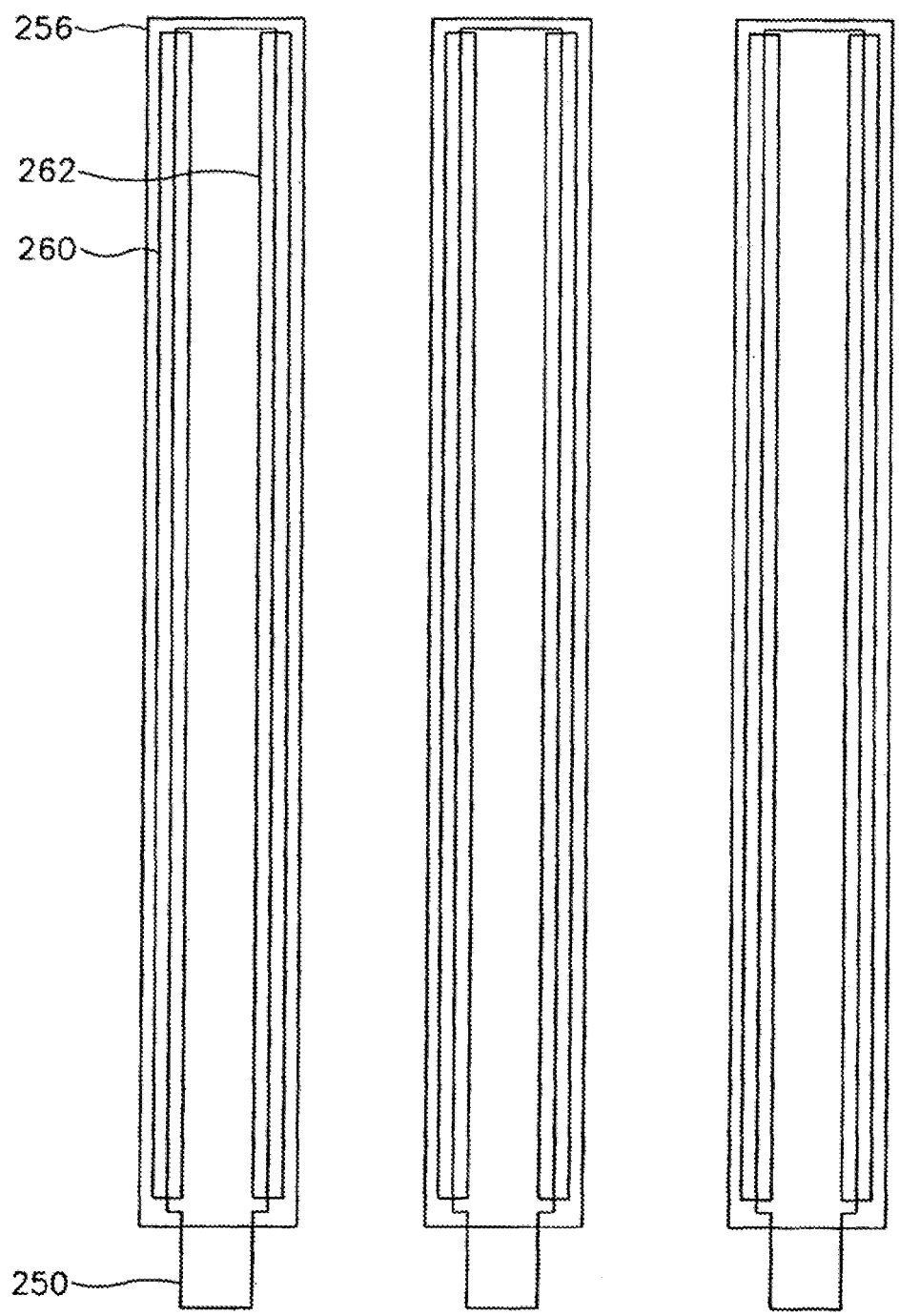

As shown in FIGS. 9, 10 and 11, since a second terminal 250 and a third terminal 256 have a pitch greater than the first terminals. Thus, the second terminal and the third terminal are aligned in one row. Pads aligned in one row are appropriate for a TCP, COF or FPC type OLB (out lead bonding) method. Since a length of the pad aligned in one row is long, a distance between a first contact region and a second contact region increases, generating a resistance difference. In this case, it is preferred to form a plurality of pad contact holes on each terminal. Particularly, ITO or IZO can be used as a pad material in a transparent type LCD.

FIGS. 9, 10 and 11 are plan views of the pad structure aligned in one row according to the present invention.

As shown in FIG. 9, at both ends of a terminal 250 on a protective layer, there is formed each pad contact hole 252, 254. A pad 256 is then formed thereon.

Further, as shown in FIG. 10, a plurality of pad contact holes 258 are formed in a protective layer in a length direction respectively apart from each other at regular intervals. The pad 256 is then formed thereon.

As shown in FIG. 11, at both ends of the terminal 250 in a wide direction, there are formed each elongated contact hole 260, 262. Then, the pad 256 is formed thereon. In this case, a second contact region between the elongated contact holes 260, 262 is designed to sufficiently have their surface areas. This embodiment is useful when forming a pad corresponding to a gate terminal that is formed under a gate insulating layer.

As described above, in case the plurality of pad contact holes are formed on each terminal, it is preferred that the first contact region is designed to have one third and below of a surface area of the second contact region. By forming the pad in this way, in which the plurality of pad contact holes are formed on each terminal, the non-uniform resistance generated by the misalignment of a probe is reduced in a full probing test which is performed before a bonding process. Also, although the pads are partially damaged or cut during the test process by the probe, the electrical connection is maintained by other contacts.

Figure 12:
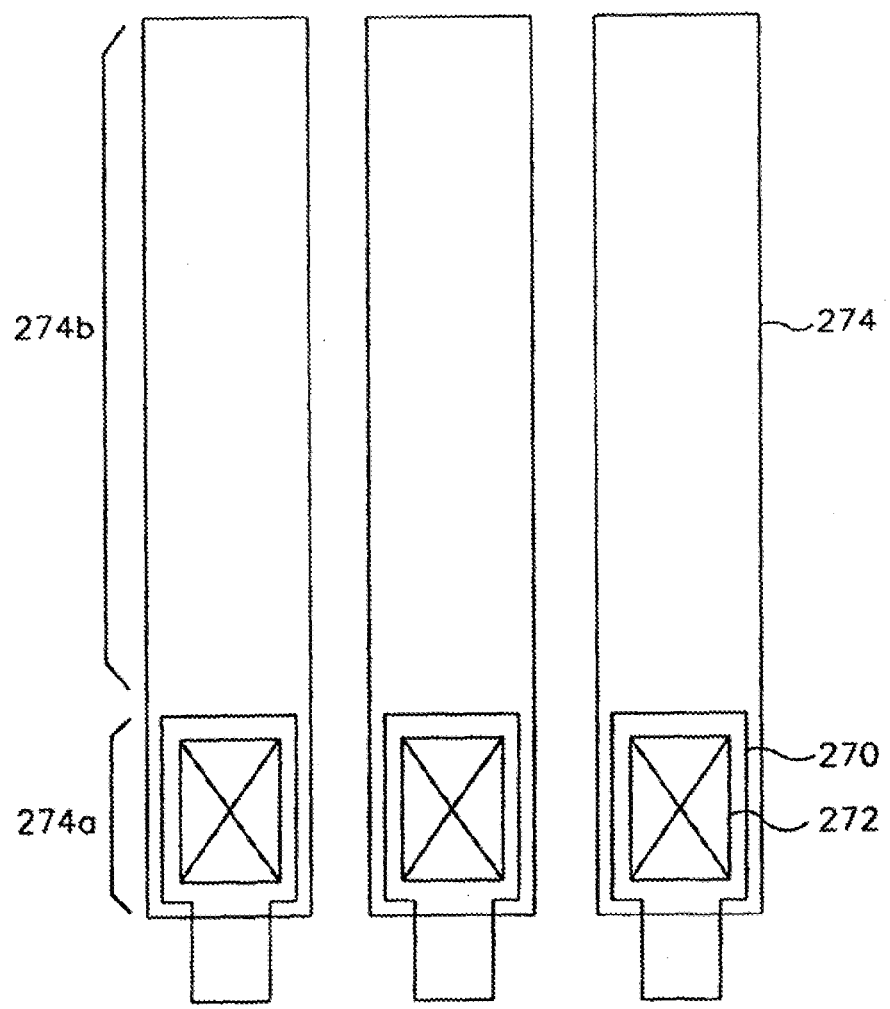
FIG. 12 is a plan view of a modified pad structure according to another embodiment of the present invention.

FIG. 12 shows a plan view of a modified pad structure according to the present invention.

As shown in FIG. 12, a surface area of a pad 274 may be twice or more as large as that of a terminal 270. In this case, a pad contact hole 272 has preferably a little smaller surface area than the terminal 270. And a first contact region 274a of pad 274 is a half or smaller size of a second contact region 274b.

FIGS. 13A through 16D are cross-sectional views and plan views showing manufacturing processes of an LCD according to the present invention.

Figure 13A:
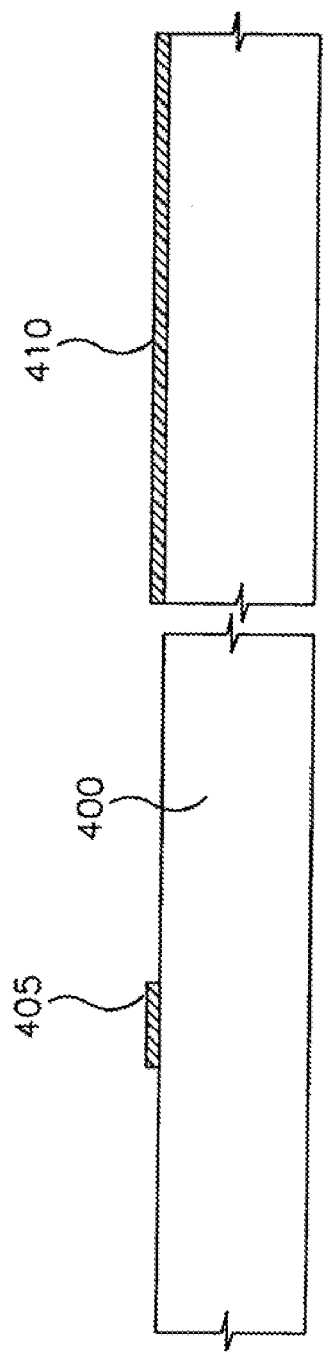
Figure 13B:
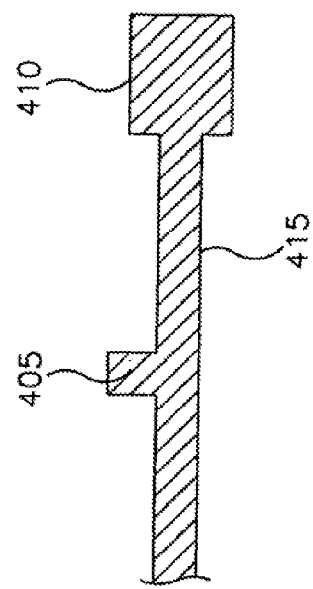

FIGS. 13A and 13B are a cross-sectional view and a plan view showing a state that a gate electrode and a gate input pad are formed on a first substrate.

Referring to FIGS. 13A and 13B, after a metallic material such as Al, Mo, Cr, Ta, Ti, Cu or W, etc., is deposited on a first substrate 400 which is formed of a non-conductive material such as glass or ceramic, the deposited metallic material is patterned so as to form a gate line 415 aligned at a desired interval in a lateral direction of the first substrate 100, a gate electrode 405 branched from the gate line 415, and a gate input terminal 410 extended to an outer wall of the first substrate 400. At this time, the gate input terminal 410 is formed to have a surface area greater than the gate electrode 405 and the gate line 415 in order to avoid a possible misalignment when forming a pad contact hole.

In addition, the gate electrode 405, the gate input terminal 410 and the gate line 415 may be respectively formed of an AI—Cu alloy or an AI—Si—Cu alloy.

Figure 14B:
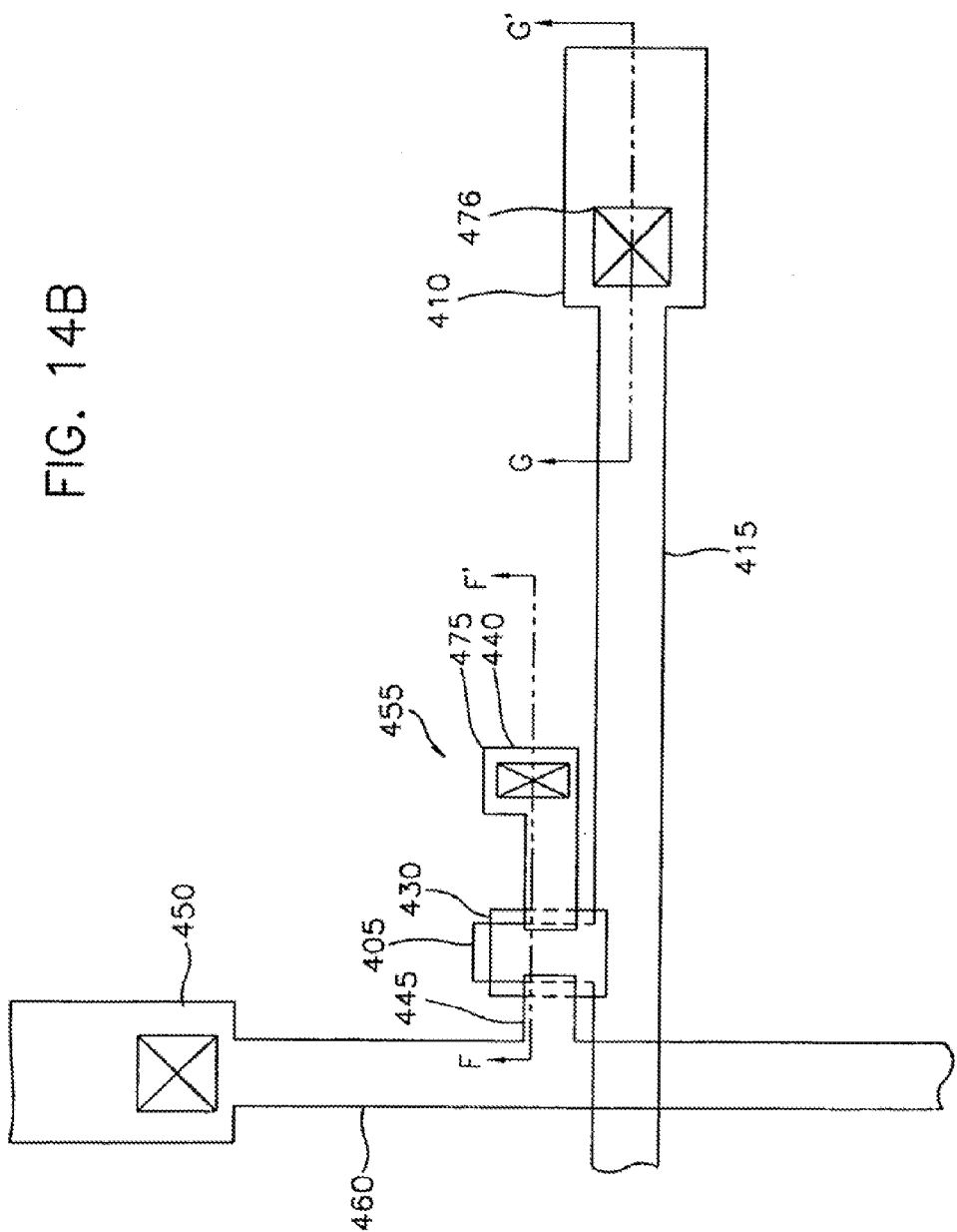

FIGS. 14A and 14B are a cross-sectional view and a plan view showing a state that a data line and a data input terminal are formed.

Referring to 14A and 14B, on the entire surface of the first substrate 400 on which the gate electrode 405, the gate input terminal 410 and the gate line 415 are formed, a silicon nitride (SiXNY) film is stacked by PCVD (plasma chemical vapor deposition). The stacked silicon nitride film is patterned to form a gate insulating layer 420.

Sequentially, a silicon material as a semiconductor material is deposited on the gate insulating layer 420. And an amorphous silicon film and an in situ doped n+ type amorphous silicon film are stacked in order by the PCVD. Then, a metallic layer formed of Al, Mo, Ta, Ti, Cr, W or Cu is stacked on the semiconductor layer formed of the semiconductor material.

The amorphous silicon film and the in situ doped n+ type amorphous silicon film are patterned to form a semiconductor layer 430 and an ohmic contact layer 435 on a portion of the gate insulating layer 420, under which the gate electrode 405 is positioned. The metallic layer is also patterned to form a data line 460 orthogonal to the gate line 420, a source electrode 440 and a drain electrode 445 branched from the data line 460, and a data input terminal 450 at a side of the data line 460. Thus, a TFT transistor 455 including the gate electrode 405, the semiconductor layer 430, the ohmic layer 435, the source electrode 440 and the drain electrode 445 is completed at a center portion of the first substrate 400 as a device forming area. The gate input terminal 410 and the data input terminal 450 are formed at an edge portion of the first substrate 400. In this case, the gate insulating layer 420 is interposed between the data line and the gate line to prevent an -electrical short therebetween.

FIG. 15 is a cross-sectional view showing a state that an organic insulating film as a protective film is formed on the first substrate.

Referring to FIG. 15, a photosensitive organic photoresist is coated on the device forming area, on which the TFT transistor 455 is formed, and a pad area 480, which is formed at the edge side of the first substrate 400, in a thickness of about 3-4 μm by a spin coating method to from an organic insulating layer 465.

In a reflective or semi-transparent LCD, in order to form a concavo-convex (prominence/recess) structure at a reflective electrode, the organic insulating layer is exposed and developed to form the concavo-convex structure at the organic insulating layer. A reflective electrode is stacked on the organic insulating layer on which the concavo-convex structure is formed. There are provided a method of fully exposing a double layer or a method of partially exposing or slit-exposing a single layer, in order to form the concavo-convex structure at the organic insulating layer.

FIGS. 16A through 16D are cross-sectional views taken along the line F-F' and G-G' of FIG. 14B and show a process of forming the organic insulating layer.

Referring to FIG. 16A, after the gate input terminal 410, the data input pad 450 (not shown) and a first mask 185 for exposing a peripheral region of the gate input terminal and the data input pad are positioned at an upper portion of the organic insulating layer 465 of the first substrate 400, an exposure process is performed with a desired light amount. Then, a contact hole 475 for exposing the drain electrode 445 of the TFT transistor 455 and a pad contact hole 476 of the data and gate input terminal 450, 410 are formed on the organic insulating layer 465 by a developing process.

Figure 16B:
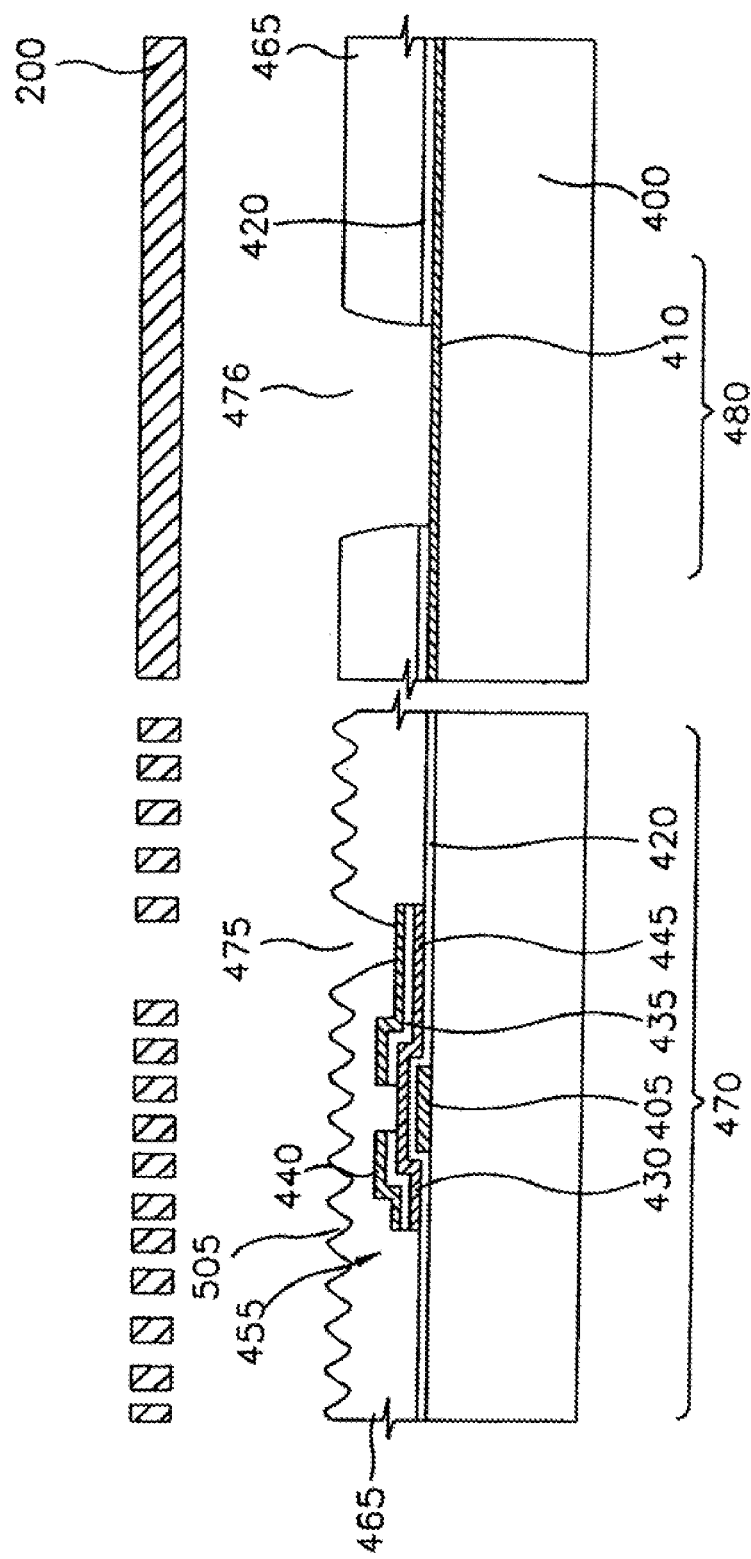

Referring to FIG. 16B, a second mask 200 is positioned on an upper portion of the organic insulating layer 465. Then a partial exposing or slit exposing process and a developing process are performed to form a plurality of concavo-convex structures 505 as micro lenses on the organic insulating layer 465 of a device area 470 of the first substrate 400.

Figure 16C:
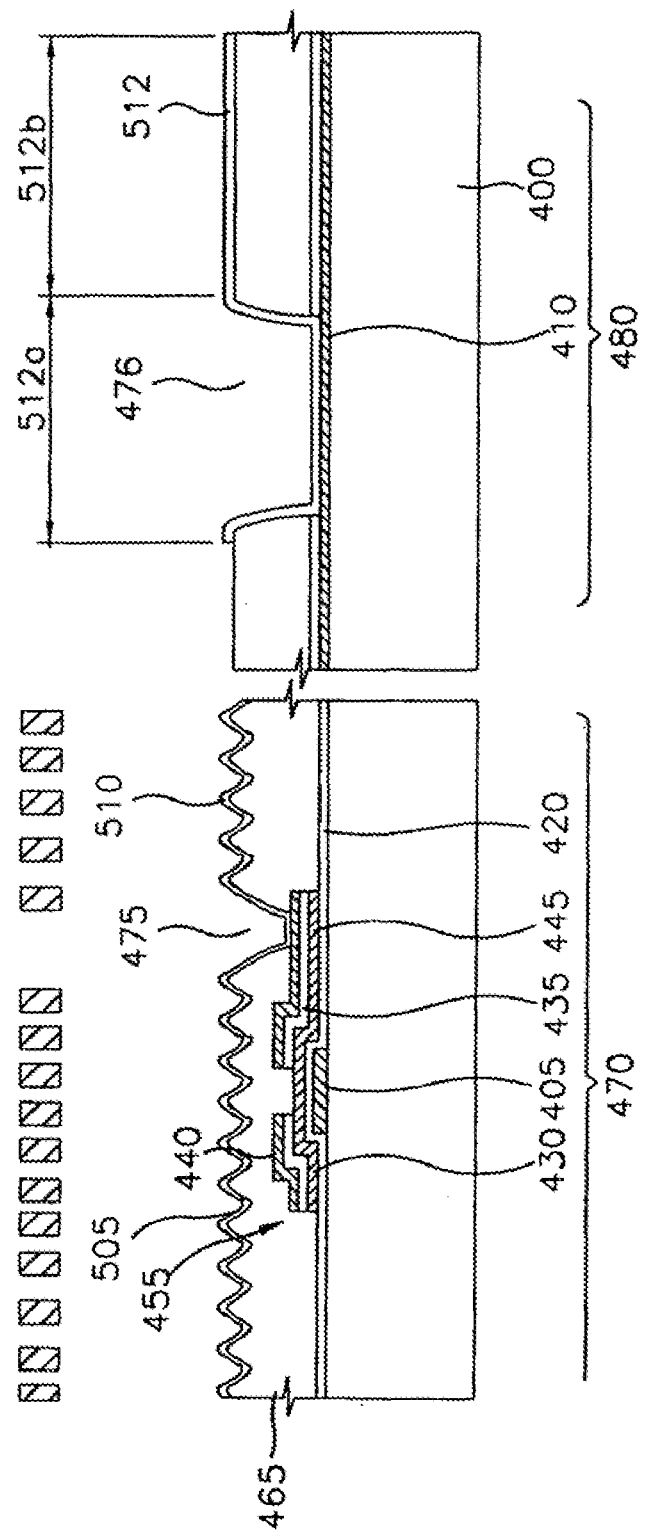

Referring to FIG. 16C, a metallic material such as Al, Ni, Cr or Ag having an excellent reflectivity is deposited at the pad area 480, an inside portion of the contact hole 475 for exposing the source electrode 445 and an upper portion of the organic insulating layer 465 on which the concavo-convex structure 505 is formed. The deposited metal is patterned in the form of a desired pixel and pad to form the reflective electrode 510 and the pad 512. Therefore, the plurality of concavo-convex structures are formed on the reflective electrode 510, which is formed on the device area 470 of the first substrate 400, according to a shape of the organic insulating layer 465. At this time, the pad 512 is formed on the data input terminal 450 and the gate input terminal 410. The pad 512 is formed to include a first contact region 512a and a second contact region 512b. The second contact region 512b is formed on a flat surface of the organic insulating layer 465.

Figure 16D:
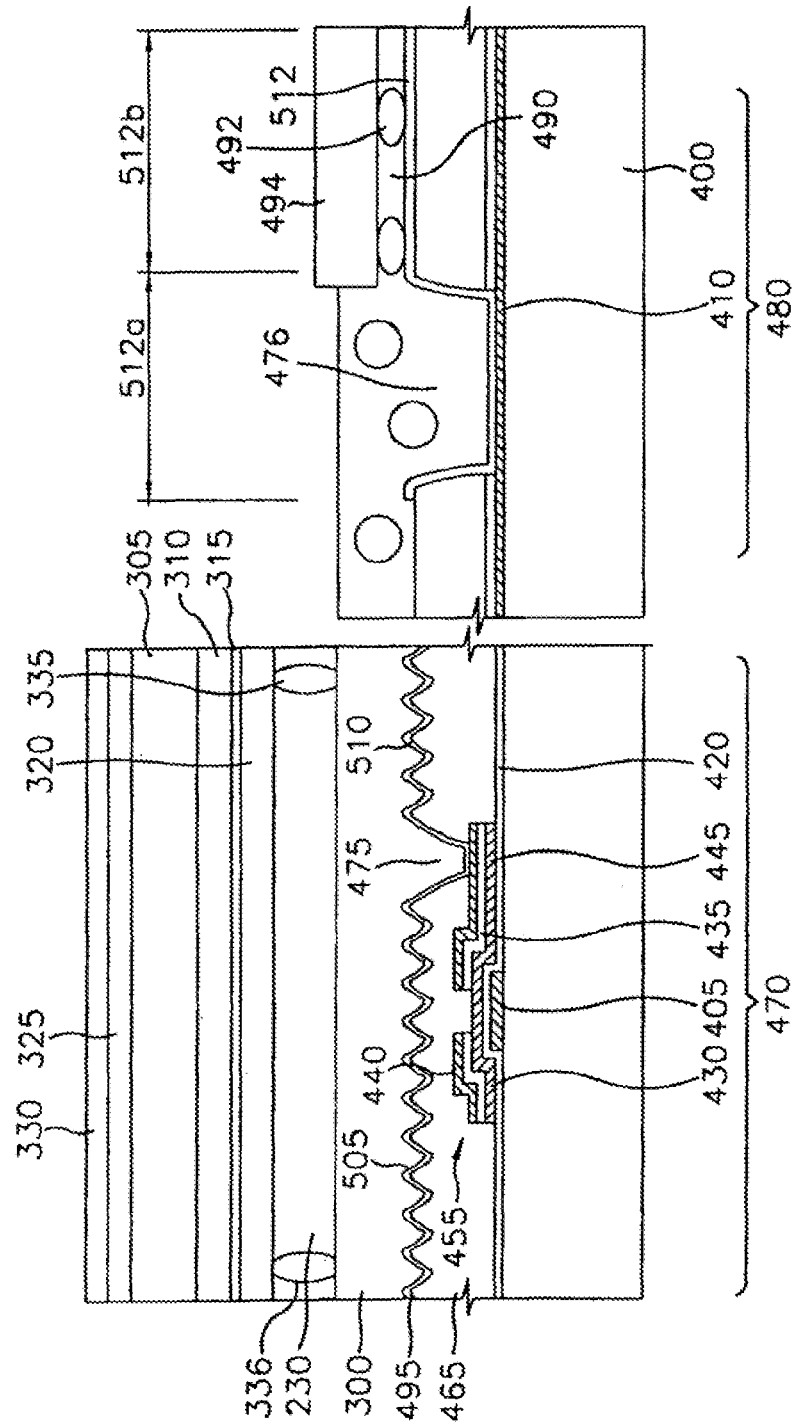

FIG. 16D is a cross-sectional view of a completed LCD according to the embodiment of the present invention. A first alignment layer 300 is formed on the resultant structure. Then, a second substrate 305 including a color filter 310, a common electrode 315, a second alignment layer 320, a phase difference plate 325 and a polarizing plate 330 is disposed on the first substrate 400.

A plurality of spacers 335, 336 are interposed between the first substrate 400 and the second substrate 305 to form a liquid crystal layer 230 at a space between the first and second substrate 400, 305, thereby forming the reflective or semi-transparent LCD.

Thereafter, an anisotropic resin layer 490 including a conductive ball 492 is disposed on a second contact region 512b of an input pad 512 that is formed on a pad portion 480 of the first substrate. A bump 494 is pressed on the anisotropic resin layer 490 of the second contact region 512b to complete a module of the reflective or semi-transparent LCD.

According to the present invention, the pad is formed on the thick protective layer in its longitudinal direction to have twice or more surface area as large as the first contact region. The remaining flat area except the first contact region is provided as the second area for contacting an external circuit terminal. Therefore, even if the external circuit terminal and the pad are misaligned, a preferred contact property can be maintained. Further, as the pad is aligned in a zigzag fashion of two rows, the adjacent pads are not shorted.

While the present invention has been described in detail, it should be understood that various changes, substitutions and alterations can be made hereto without departing from the spirit and scope of the invention as defined by the appended claims.

For example, in case of the backlight LCD, the concavo-convex structure is not formed on the protective layer, and a transparent conductive material such as ITO and IZO is used as the reflective electrode and pad material.

What is claimed is:

1. A display panel, comprising:
   a substrate;
   a pixel formed in a display region of the substrate;
   a terminal formed at a non-display region of the substrate and configured to apply an electrical signal to the pixel;
   a protective layer formed on the terminal and having a contact hole on the terminal; and
   a pad formed on the protective layer and overlapping the terminal,
   wherein the pad includes a first contact region contacting the terminal through the contact hole and a second contact region defined as a region of the pad except the first contact region, and
   wherein the second contact region is substantially larger than the first contact region, and has a flat portion on the protective layer.

2. The display panel of claim 1, wherein the protective layer is an organic insulating layer.

3. The display panel of claim 2, wherein the pad is connected to the terminal that is formed at a lower portion of the protective layer through at least two contact holes.

4. The display panel of claim 3, wherein the contact holes are arranged at predetermined intervals in the longitudinal direction.

5. The display panel of claim 4, wherein an entire area of the contact hole overlaps the terminal.

6. The display panel of claim 1, wherein the pad is connected to the terminal that is formed at a lower portion of the protective layer through at least two contact holes.

7. The display panel of claim 6, wherein the contact holes are arranged at predetermined intervals in the longitudinal direction.

8. The display panel of claim 7, wherein an entire area of the contact hole overlaps the terminal.

9. The display panel of claim 1, wherein an entire area of the contact hole overlaps the terminal.

10. The display panel of claim 9, wherein the pad is connected to the terminal that is formed at a lower portion of the protective layer through at least two contact holes.

* * * * *